(12) United States Patent
Homma et al.

(10) Patent No.: US 10,897,004 B2
(45) Date of Patent: Jan. 19, 2021

(54) PIEZOELECTRIC DRIVE DEVICE

(71) Applicant: TDK CORPORATION, Tokyo (JP)

(72) Inventors: Mitsunao Homma, Tokyo (JP);
Masahiro Hosokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 738 days.

(21) Appl. No.: 15/695,485

(22) Filed: Sep. 5, 2017

(65) Prior Publication Data
US 2018/0076380 A1   Mar. 15, 2018

(30) Foreign Application Priority Data

Sep. 9, 2016 (JP) .................... 2016-177117

(51) Int. Cl.
| | |
|---|---|
| *H01L 41/09* | (2006.01) |
| *H01L 41/083* | (2006.01) |
| *B60J 1/17* | (2006.01) |
| *E05F 15/60* | (2015.01) |
| *G02B 7/08* | (2006.01) |
| *H01L 41/047* | (2006.01) |
| *H01L 41/04* | (2006.01) |

(Continued)

(52) U.S. Cl.
CPC ............ *H01L 41/09* (2013.01); *H01L 41/042* (2013.01); *H01L 41/0471* (2013.01); *H01L 41/0472* (2013.01); *H01L 41/083* (2013.01); *H02N 2/002* (2013.01); *H02N 2/025* (2013.01); *B60J 1/17* (2013.01); *E05F 15/60* (2015.01); *G02B 7/08* (2013.01)

(58) Field of Classification Search
CPC ... H01L 41/09; H01L 41/0471; H01L 41/042; H02N 2/002
See application file for complete search history.

(56) References Cited

U.S. PATENT DOCUMENTS 9,691,964 B2 * 6/2017 Ozawa ................. H01L 41/083
2003/0222240 A1   12/2003 Sasaki et al.
(Continued)

FOREIGN PATENT DOCUMENTS

| CN | 1475457 A | 2/2004 |
|---|---|---|
| CN | 104882535 A | 9/2015 |

(Continued)

*Primary Examiner* — Thomas M Dougherty
*Assistant Examiner* — Karen B Addison
(74) *Attorney, Agent, or Firm* — Oliff PLC

(57) ABSTRACT

A piezoelectric drive device including: laminated piezoelectric element including a first end face and a second end face opposed to the first end face; a weight member attached to the first end face; and a shaft attached to the second end face, in which a moving member, engaged to the shaft movable in an axial direction, is moved by activating the laminated piezoelectric element. Inside the laminated piezoelectric element, a first internal electrode and a second internal electrode, respectively having a plane surface approximately perpendicular to the first end face and the second end face, are laminated in Y axial direction, approximately perpendicular to the first internal electrode and the second internal electrode with a piezoelectric layer in-between. The piezoelectric drive device, in which the laminated piezoelectric element is difficult to bend, even when the load is applied to the shaft from a lateral direction, is provided.

17 Claims, 9 Drawing Sheets

(51) Int. Cl.
*H02N 2/00* (2006.01)
*H02N 2/02* (2006.01)

(56) References Cited

U.S. PATENT DOCUMENTS

| | | | |
|---|---|---|---|
| 2013/0233278 A1* | 9/2013 | Sato | F02M 51/0603 |
| | | | 310/366 |
| 2014/0167568 A1* | 6/2014 | Ozawa | H01L 41/0475 |
| | | | 310/364 |
| 2015/0243876 A1 | 8/2015 | Ozawa et al. | |

FOREIGN PATENT DOCUMENTS

| | | |
|---|---|---|
| JP | H05-198861 A | 8/1993 |
| JP | 2008-199773 A | 8/2008 |
| JP | 2014-168132 A | 9/2014 |
| JP | 2015-008300 A | 1/2015 |

* cited by examiner

PIEZOELECTRIC DRIVE DEVICE

BACKGROUND OF THE INVENTION

1. Field of the Invention

The present invention relates to a piezoelectric drive device moving a moving body, such as a lens frame, along a shaft.

2. Description of the Related Art

As the piezoelectric drive device, driving the lens frame in the axial direction using a laminated piezoelectric element, such as the device according to Patent Article 1 is known. As shown in Patent Article 1, according to the conventional piezoelectric drive device, a weight member is connected to a first end face of the laminated piezoelectric element and a shaft is connected to a second end face opposed to the first end face. Then, a vibration is applied to the shaft by driving the piezoelectric element, and the moving body is moved in the axial direction of the shaft.

According to the laminated piezoelectric element used for the conventional piezoelectric drive device, generally an internal electrode and a piezoelectric layer are alternately laminated, to be parallel to the first end face or the second end face. It was considered that by using the laminated piezoelectric element, in which internal electrodes are laminated in such direction, a driving force transmitted to the shaft becomes large, and the moving body is efficiently moved.

In such conventional piezoelectric drive device, however, the laminated piezoelectric element, in which the internal electrode and the piezoelectric layer are alternately laminated to be parallel to the first end face or the second end face, is used. Thus, there is a problem that it is easily bended when a load is applied to the shaft from a lateral direction. Specially, a crack is generated along the plane surface parallel to the internal electrode, and is easy to bend.

Patent Document 1: JP 2008-199773A

DISCLOSURE OF THE INVENTION

Means for Solving the Problems

The present invention was devised to solve the above problems, and an object of the invention is to provide a piezoelectric drive device in which the laminated piezoelectric element is difficult to bend, even when the load is applied to the shaft from a lateral direction.

In order to solve the above problems, the piezoelectric drive device of the invention includes:

a laminated piezoelectric element including a first end face and a second end face opposed to the first end face;

a weight member attached to the first end face of the laminated piezoelectric element; and a shaft attached to the second end face of the laminated piezoelectric element, in which a moving member, engaged to a shaft movable in an axial direction, is moved in the axial direction by activating the laminated piezoelectric element, and a first internal electrode and a second internal electrode, respectively having a plane surface which is approximately perpendicular to the first end face and the second end face, are laminated in a direction approximately perpendicular to the first internal electrode and the second internal electrode with a piezoelectric layer in-between, inside the laminated piezoelectric element.

According to the piezoelectric drive device of the invention, the first internal electrode and the second internal electrode, respectively having a plane surface which is approximately perpendicular to the first end face and the second end face, are laminated in a direction approximately perpendicular to said first internal electrode and said second internal electrode with a piezoelectric layer in-between. Thus, even when a load is applied to such as the shaft from a lateral direction, the force acts in a direction to bend a plural number of the laminated internal electrodes, and does not act in the direction to peel off the interface of the internal electrodes inside the laminated piezoelectric element. Therefore, different from conventional, the laminated array of the internal electrodes inside the laminated piezoelectric element has a structure capable of resisting the bending of the element, and it can effectively prevent the bent, crack, etc. of the element.

In addition, the lamination direction of the internal electrodes according to the present piezoelectric drive device is different from the same of the conventional piezoelectric drive device. Thus, the present piezoelectric drive device has a structure strong for a resonance in a direction from the first end face to the second end face, and that it becomes possible to use at a higher frequency relative to the conventional one. Therefore, it becomes possible to increase a number of times applying a displacement to the shaft, improving a responsiveness.

In addition, it is a simple structure in which the first internal electrode and the second internal electrode repeatedly placed in a same direction with a piezoelectric layer in-between. And thus, a crack is difficult to generate when such as firing, and it is easy to polarize the piezoelectric layer.

A length of the laminated piezoelectric element corresponding to a distance between the first end face and the second end face is preferably longer than a thickness of the laminated piezoelectric element in the laminated direction along the direction approximately perpendicular to the first internal electrode and the second internal electrode. Conventionally, when a distance between the first end face and the second end face is made long, a number of laminated layer of the internal electrodes parallel to the first end face and the second end face became large or a thickness of the piezoelectric layer on which the internal electrodes are not laminated became thick. Thus, the piezoelectric element becomes easy to bend along the interface of the piezoelectric layer.

To the contrary, according to the present invention, it is possible to lengthen the distance between the first end face and the second end face by lengthening the length of the internal electrode in a longitudinal direction. The structure of the invention is difficult to bend relative to the conventional one. In addition, by lengthening the length of the internal electrode in a longitudinal direction, an area of the internal electrode becomes large and a volume of the piezoelectric layer between internal electrodes becomes large, and it is possible to make the displacement of the piezoelectric element in the longitudinal direction large.

A first external electrode connected to the first internal electrode and a second external electrode connected to the second internal electrode are respectively formed on a side of the laminated piezoelectric element, located close to either one of the first end face and the second end face.

With the configuration above, a wire, applying voltage to each of the first internal electrode and the second internal electrode of the laminated piezoelectric element, can be provided near either one of the weight member or the shaft, which makes the wiring easy. In particular, the weight member is placed at a fixed side, and thus the wiring becomes easy.

The weight member is preferably adhered to the first end face via a first adhesive agent. In case when the first external electrode and the second external electrode are placed near the first end face, said first adhesive agent is capable of preventing a connecting member, connecting the first external electrode or the second external electrode to an external circuit, to enter the first end face.

The shaft is more preferably adhered to the second end face via a second adhesive agent. In case when the first external electrode and the second external electrode are placed near the first end face, said second adhesive agent can secure the insulation between an end of the first internal electrode and the same of the second internal electrode, those may be exposed at the second end face.

In case when the first external electrode and the second external electrode are placed near the second end face, the first adhesive agent can secure the insulation between an end of the first internal electrode and the same of the second internal electrode, which may be exposed at the first end face. Further, the second adhesive agent is capable of preventing a connecting member, connecting the first external electrode or the second external electrode to an external circuit, to enter the second end face.

In the present invention, the first internal electrode and the second internal electrode each having a plane approximately perpendicular to the first end face or the second end face are laminated in a direction approximately perpendicular to the first internal electrode and the second internal electrode. Thus, each end of the first internal electrode and the second internal electrode may be exposed at the first end face or the second end face. The first adhesive agent covers the first end face and the second adhesive agent covers the second end face. Therefore, it is capable to effectively protect the exposed end faces of said internal electrodes. Note that, the protective insulating layer may be preliminary formed on the first end face or the second end face.

The first adhesive agent may be also a member for fixing the weight member to a concave part of a frame member. The weight member may be fixed to the concave part of the frame member, and that the used adhesive agent may also be used to adhere the first end face of the laminated piezoelectric element to the weight member.

The first external electrode connected to the first internal electrode may be formed on the first end face and the second external electrode connected to the second internal electrode may be formed on the second end face. In this case, the first external electrode is connected to the first wire provided near the weight member, and the second external electrode may be connected to the second wire via the shaft.

Possibly, the first external electrode may include the first end face electrode formed on the first end face and the first side face electrode formed continuously from the first end face electrode at one side of the laminated piezoelectric element, and the second external electrode may include the second end face electrode formed on the second end face and the second side face electrode formed continuously from the second end face electrode at the other side of the laminated piezoelectric element.

In this case, the external circuit may be connected to the first side face electrode and the second side face electrode, and that the wire for the external circuit can be provided only to a side of either the weight member or the shaft. Further, the first end face is covered with the first end face electrode and the second end face is covered with the second end face electrode, and that end faces thereof can be effectively protected.

Preferably, the end part of the second side face electrode is placed close to the first end face electrode. In this case, insulation between the end part of the second side face electrode and the first end face electrode is preferably secured by the first adhesive agent, adhering the first end face of the laminated piezoelectric element to the weight member.

Possibly, the end part of the first side face electrode may be placed close to the second end face electrode. In this case, insulation between the end part of the first side face electrode and the second end face electrode is preferably secured by the second adhesive agent, adhering the second end face of the laminated piezoelectric element to the shaft.

In case when the wire for the external circuit is placed near the weight member, the connecting member, connecting said wire and either one of the first side face electrode or the second side face electrode, is formed to contact the first adhesive agent, and prevented to enter the gap between the second side face electrode and the first end face electrode.

In case when the wire for the external circuit is placed near the shaft, the connecting member, connecting the wire and either one of the first side face electrode or the second side face electrode, is formed to contact the second adhesive agent, and prevented to enter the gap between the first side face electrode and the second end face electrode.

DESCRIPTION OF THE PREFERRED EMBODIMENTS

Hereinafter, the present invention will be described based on the embodiments shown in figures.

The First Embodiment

Figure 1:
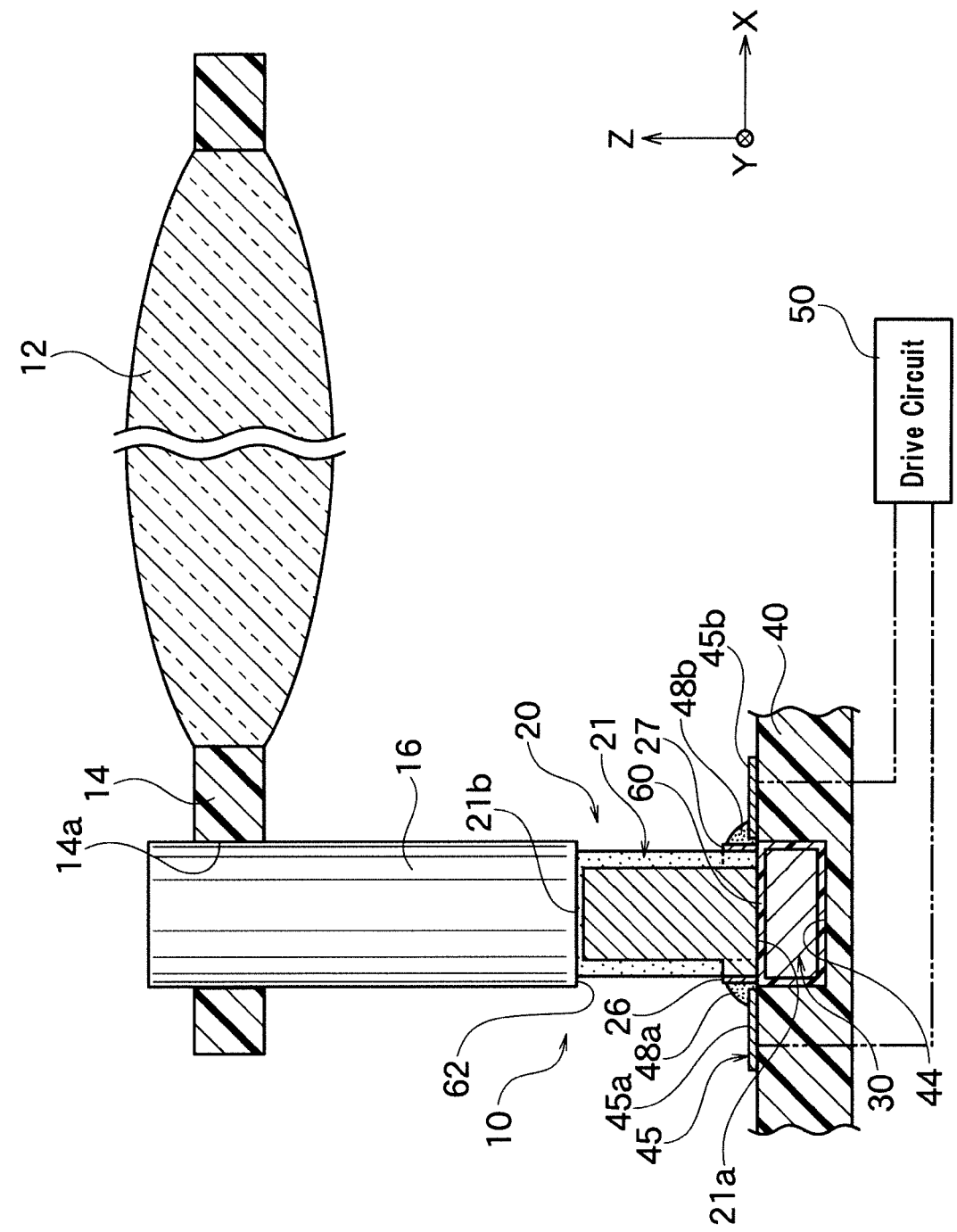
FIG. 1 is a schematic cross sectional view of a lens drive device having a piezoelectric drive device of an embodiment of the invention.

As shown in FIG. 1, piezoelectric drive device 10 according to an embodiment of the invention is a lens drive device, which moves lens frame 14, a movable body, holding lens 12 installed in such as a camera, along axial direction (Z axial direction) of shaft 16. Lens frame 14 is engaged to a predetermined position of shaft 16 in the axial direction by friction, and installed movably in the axial direction.

Shaft 16 vibrates by the laminated piezoelectric element 20 which stretches and vibrates in the axial direction. With said vibration, lens frame 14 is moved to one side or the other side of shaft 16 in Z axial direction. A moving direction and a moving amount are determined according to a formation of the voltage waveform or the applied time applied to laminated piezoelectric element 20.

Piezoelectric drive device 10 includes shaft 16, laminated piezoelectric element 20 and weight member 30. Shaft 16 generally has a cylindrical form, and is composed of such as nonferrous metal such as a carbon-reinforced plastic, a steel material such as a stainless steel, aluminum, and polyamidimide. Shaft 16 is inserted and engaged to through hole 14a formed on lens frame 14, and holds lens frame 14 movable in Z axial direction. Note, in figures, X axis, Y axis and Z axis are mutually perpendicular. Z axis agrees with the axial direction of shaft 16.

Figure 2:
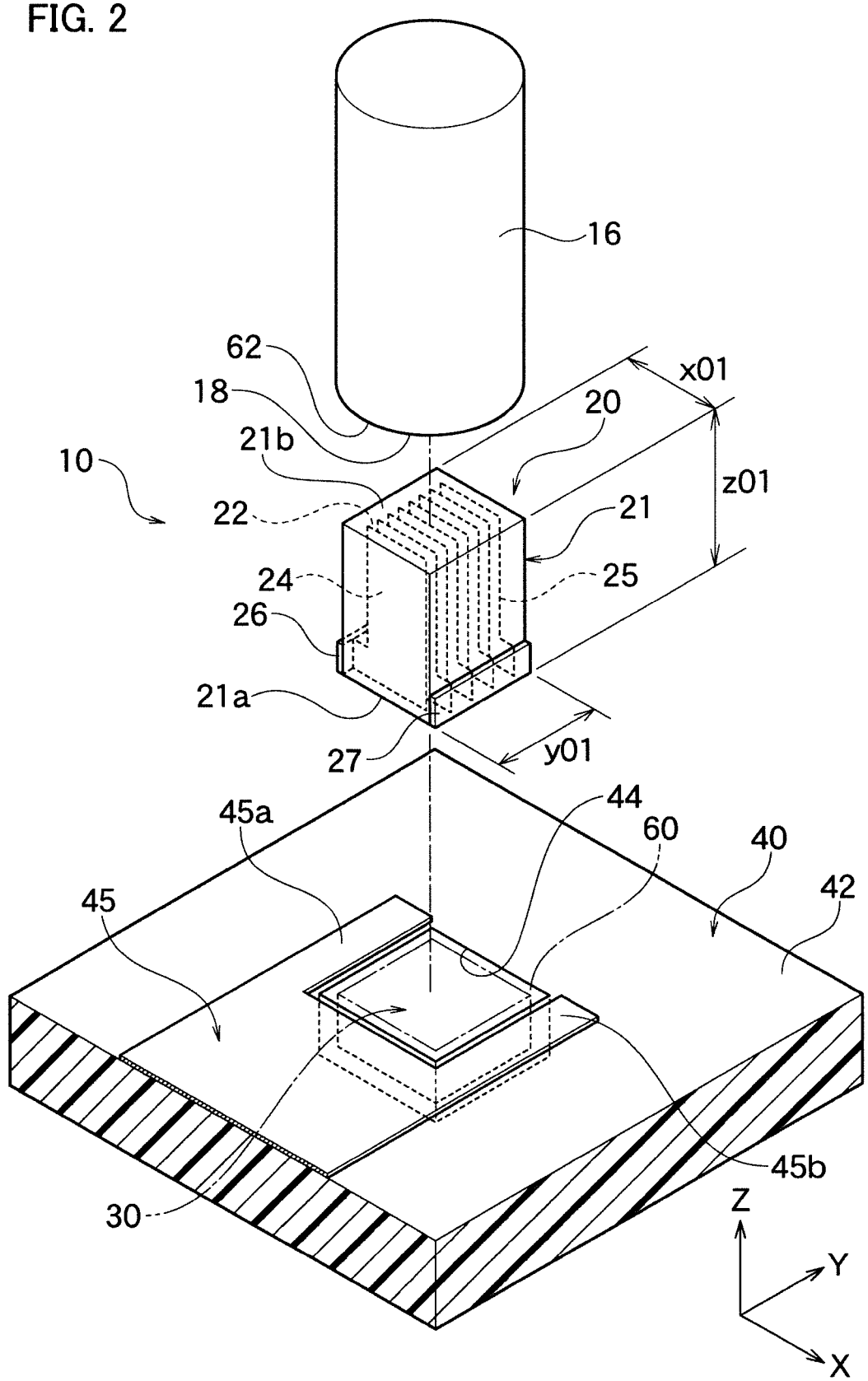
FIG. 2 is an exploded perspective view of the piezoelectric drive device shown in FIG. 1.

As shown in FIG. 2, laminated piezoelectric element 20 includes element body 21 having an outer shape of approximately rectangular cylinder shape, a square pole in the present embodiment, the first external electrode 26 and the second external electrode 27. Element body 21 includes the first end face 21a and the second end face 21b each placed at a side mutually opposite in Z axial direction. Weight member 30 is adhered to the first end face 21a via the first adhesive agent 60. In addition, bottom side end face 18 of shaft 16 is adhered to the second end face 21b via the second adhesive agent 62.

Inside element body 21, the first internal electrode 24 and the second internal electrode 25, each having a plane (the plane of the present embodiment includes an axis parallel to Z axis) approximately perpendicular to the first end face 21a and the second end face 21b, are alternately laminated in Y axial direction having piezoelectric layer 22 in-between. Piezoelectric layer 22, in which the first internal electrode 24 and the second internal electrode 25 are alternately laminated, becomes an activating part where expansion/contraction deformation is performed in Z axial direction. Note, an outer shape of element body 21 is not particularly limited to a rectangular cylinder form, and it can be a cylinder form, an elliptic cylinder form, and etc.

Figure 3A:
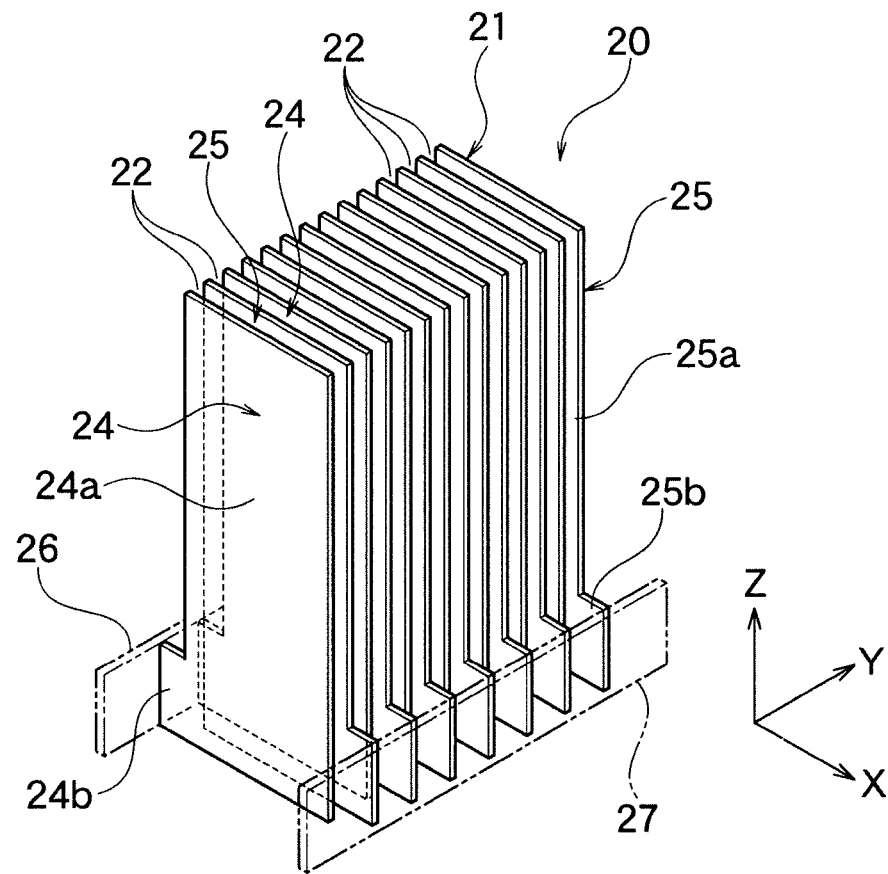
FIG. 3A is a perspective view showing a laminated structure of the internal electrode placed inside the laminated piezoelectric element shown in FIG. 2.
Figure 3B:
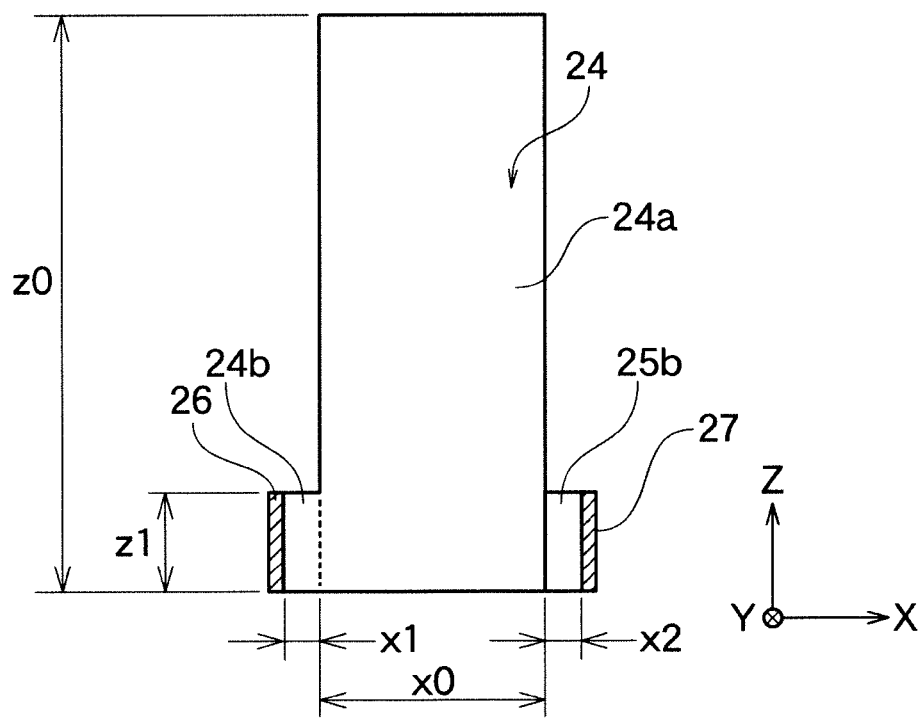
FIG. 3B is a front view of the internal electrode shown in FIG. 3A.

As shown in FIGS. 3A and 3B, the first internal electrode 24 includes electrode body 24a of a flat plate form and lead part 24b, formed integrally with electrode body 24a and protrude to X axial direction from the bottom end of electrode body 24a in Z axial direction. The protrusion length x1 of lead 24b is projected slightly from X axial edge of electrode body 24a, and is 0.3 mm or less.

In addition, width z1 of lead 24b in Z axial direction is determined, when a height of electrode body 24a in Z axial direction is z0, to satisfy a relation z1/z0 to be preferably 0.05 to 0.2. According to the present embodiment, lead 24b is connected to the first external electrode 26 formed at a bottom part of a side of element body 21, facing X axial direction. A width of first external electrode 26 in Z axial direction is the same with the width of lead 24b in Z axial direction, however, they may be different.

As shown in FIGS. 3A and 3B, the second internal electrode 25 includes electrode body 25a of a flat plate form and lead part 25b, formed integrally with electrode body 25a and protrude to X axial direction from the bottom end of electrode body 25a in Z axial direction. The protrusion length x2 of lead 25b projected from X axial edge of electrode body 25a is approximately the same with the protrusion length x1.

In addition, a width of lead 25b in Z axial direction is approximately the same with the width z1 of lead 25a in Z axial direction. According to the present embodiment, lead 25b is projected to the opposite side from lead 24b along X axial direction, and is connected to the second external electrode 27 formed at a bottom part of a side face of element body 21, placed at an opposite side of the first external electrode 26. A width of first external electrode 27 in Z axial direction is the same with the width of lead 25b in Z axial direction, however, they may be different.

According to the present embodiment, piezoelectric layer 22 in-between electrode bodies 24a, 25a becomes an activating layer, and displacement is generated when voltage is applied to piezoelectric layer 22. A height z0 of electrode bodies 24a, 25a in Z axial direction is approximately the same with the height of element body 21 in Z axial direction. Ends of electrode bodies 24a, 25a in z axial direction may be respectively exposed to the first end face 21a or the second end face 21b of element body 21. The exposed parts are coated by the first adhesive agent 60 and the second adhesive agent 62.

Ends of electrode bodies 24a, 25a in z axial direction each may be somewhat drawn back from the first end face 21a or the second end face 21b of element body 21. Otherwise, an insulating protective layer composed of a resin may be formed on the first end face 21a or the second end face 21b.

As shown in FIG. 2, the first external electrode 26 and the second external electrode 27 are respectively formed on an opposing pair side faces in X axial direction of element body 21, along Y axial direction, close to the bottom ends in Z axial direction (near weight member 30). According to the present embodiment, as shown in FIG. 1, weight member 30 is fixed to inner side of concave part 44 formed at surface 42 of frame 40, located at a bottom side in Z axial direction, using the first adhesive agent 60. The surface of weight member 30 and the surface 42 of frame 40 are approximately flat. Frame 40 may be a fixed material, in which a case surrounding lens holding frame 14 shown in FIG. 1 is installed.

According to the present embodiment, the surface of weight member 30 is adhered and fixed to the first end face 21a of element body 21, using the same adhesive agent with the first adhesive agent 60 adhering weight member 30 to inner side of concave part 44.

As shown in FIG. 2, FPC (Flexible Printed Circuit Board) 45 is placed on the surface of frame 40 avoiding weight member 30 (concave part 44). The first wire 45a and the second wire 45b are placed along the opening edge of concave part 44, facing each other in X axial direction. As shown in FIG. 1, the first wire 45a is connected to connecting member 48a and connecting member 48a is connected to the first external electrode 26. The second wire 45b is connected to connecting member 48b and connecting member 48b is connected to the second external electrode 27.

Connecting members 48a, 48b are not particularly limited, however, they are composed of a conductive paste, a solder, etc., and electrically connect the first wire 45a and the first external electrode 26, and electrically connect the second wire 45b and the second external electrode 27.

The first wire 45a and the second wire 45b in FIG. 2 are insulated inside FPC 45, and respectively connected to drive circuit 50 shown in FIG. 1. Note, the first wire 45a and the second wire 45b may be a circuit pattern formed directly on a surface of insulating frame 40, respectively. These circuit patterns can be formed by a firing method, a plating method, a sputtering method, etc. of a metal paste on a surface of frame 42 composed by an insulating material.

As the conductive materials composing the first internal electrode 24 and the second internal electrode 25, a noble metal such as Ag, Pd, Au, Pt, etc. and alloys thereof (such as Ag—Pd) or a base metal such as Cu, Ni, etc., and alloys thereof can be exemplified, however, they are not limited thereto.

Conductive materials composing the first external electrode 26 and the second external electrode 27 are not particularly limited, and the same material with the conductive materials composing the internal electrode can be used. Note, the first external electrode 26 and the second external electrode 27 are formed on outer surface of element body 21 by such as firing the conductive paste; and on the surface thereof, a plating layer or a sputtering layer of various metals mentioned above can be formed. A thickness of external electrodes 26, 27 are not particularly limited, however, it is preferably 0.5 to 50 μm.

The material of piezoelectric layer 22 is not particularly limited as long as it shows a piezoelectric effect or an inverse piezoelectric effect, and $PbZrx$, $Ti_{1-x}O_3$, $BaTiO_3$, etc. can be exemplified. In addition, the component enhancing the characteristics or so can be included, and the content thereof can be suitably determined corresponding to the desired characteristic.

As shown in FIG. 2, in piezoelectric drive device 10, a top face of weight member 30 in Z axial direction is placed opposite to the first end face 21a, a bottom end face of element body 21 in Z axial direction. Weight member 30 has a rectangular parallelepiped shape as a whole; however, the shape is not limited thereto.

Weight member 30 is preferable to include such as metal materials having relatively large specific gravity such as tungsten, in order to preferably function as an inertial body to provide displacement to shaft 16; however, it is not limited thereto and it can be composed by iron, steel material, noble metal, aluminum, etc. Note, weight member 30 can be composed by insulating materials such as plastic, ceramic, etc.

Drive circuit 50 shown in FIG. 1 is a circuit applying a drive voltage to laminated piezoelectric element 20. Drive circuit 50 may be installed in frame 40 or may be disposed separately from frame 40.

A voltage waveform output by drive circuit 50 is not particularly limited; however, drive circuit 50 can generate a deformation amount of laminated piezoelectric element 20 and an accompanying movement amount exceeding a displacement amount of shaft 16 at lens frame 14 as a moving member, by outputting a voltage waveform of a sawtooth waveform.

According to piezoelectric drive device 10 of the present embodiment, the first internal electrode 24 and the second internal electrode 25, respectively having a plane surface which is approximately perpendicular to the first end face 21a and the second end face 21b, are laminated in a single Y axial direction with a piezoelectric layer in-between. Thus, even when a load is applied to such as shaft 16 from a lateral direction, the force acts in a direction to bend a plural number of the laminated internal electrodes 24 and 25 inside element body 21 of laminated piezoelectric element 20, and does not act in the direction to peel off the interface of the internal electrodes 24, 25. Therefore, different from conventional, the laminated array of the internal electrodes 24, 25 inside the laminated piezoelectric element 20 has a structure capable of resisting the bending of the element 20, and it can effectively prevent the bent, crack, etc. of element 20.

The lamination direction of internal electrodes in piezoelectric drive device 10 is different from the same of the conventional piezoelectric drive device. Thus, piezoelectric drive device 10 has a structure strong for a resonance in a direction from the first end face 21a to the second end face 21b, and that it becomes possible to use at a higher frequency relative to the conventional one. Therefore, it becomes possible to increase a number of times applying a displacement to shaft 16, improving a responsiveness.

It is a simple structure in which the first internal electrode 24 and the second internal electrode 25 repeatedly placed in a same direction with a piezoelectric layer 22 in-between. And thus, a crack is difficult to generate even when such as firing, and it is easy to polarize piezoelectric layer 22.

According to the present embodiment, as shown in FIG. 2, a height z01 in Z axial direction of laminated piezoelectric element 20 (approximately the same with the height z0 shown in FIG. 3B) is longer than thickness y01 of laminated piezoelectric element 20 in the laminated direction along the direction approximately perpendicular to the first internal electrode 24 and the second internal electrode 25; however, it is not limited thereto. Furthermore, according to the present embodiment, width x01 in X axial direction of laminated piezoelectric element 20 is approximately the same with thickness y01 in laminated direction; however, they are not limited thereto and may be different.

Conventionally, in order to lengthen a distance between the first end face 21a and the second end face 21b, a number of laminated layers of the internal electrodes parallel to the first end face 21a and the second end face 21b becomes large, or a thickness of the piezoelectric layer on which the internal electrodes are not laminated becomes thick. Thus, the piezoelectric element becomes easy to bend along the interface of the piezoelectric layer.

To the contrary, according to the present embodiment, it is possible to lengthen the distance between the first end face 21a and the second end face 21b by lengthening the length of the internal electrodes 24, 25 in Z axial direction. The structure of the embodiment is difficult to bend relative to the conventional one. In addition, it is possible to make areas of the internal electrodes 24, 25 large and to make a volume of piezoelectric layer 22 between internal electrodes 24, 25 large, by lengthening the length of the internal electrodes 24, 25 in a longitudinal direction. And the displacement of piezoelectric element 20 in Z axial direction can be made large.

According to the embodiment, the first external electrode 26 and the second external electrode 27 are respectively formed on a side of element body 21, located close to the first end face 21a. Thus, the first wire 45a and the second wire 45b can be provided on the surface of frame 40 near weight member 30, which makes the wiring easy. In particular, weight member 30 is placed at a fixed side of frame 40, and thus the wiring becomes easy.

According to the embodiment, weight member 30 is adhered to the first end face 21*a* of element 21 via the first adhesive agent 60. According to the embodiment, the first external electrode 26 and the second external electrode 27 are placed near the first end face 21*a*. Thus, the first adhesive agent 60 is capable of preventing connecting members 48*a*, 48*b*, connecting the first external electrode 26 and the second external electrode 27 to wire 45*a* and wire 45*b*, respectively, to enter the first end face 21*a*.

According to the embodiment, at the second end face 21*b*, bottom side end face 18 of shaft 16 in Z axial direction is adhered to the second end face 62 via the second adhesive agent 62. The second adhesive agent 62 can secure the insulation between an end of the first internal electrode 24 in Z axial direction and the same of the second internal electrode 25 in Z axial direction, those may be exposed at the second end face 21*b*.

According to element body 21 of the present embodiment, each end of the first internal electrode 24 and the second internal electrode 25 in Z axial direction may be exposed at the first end face 21*a* or the second end face 21*b*. The first adhesive agent 60 covers the first end face 21*a*, and the second adhesive agent 62 covers the second end face 21*b*. Thus, ends in which said internal electrodes 24, 25 are exposed can be effectively protected by adhesive agents 60, 62, respectively. Note, the protective insulating layer may be preliminary formed on the first end face 21*a* or the second end face 21*b*, as mentioned above.

According to the embodiment, the first adhesive agent 60 may be also a member for fixing weight member 30 to concave part 44 of frame 40; and thus, less adhesive agent is wasted. In addition, according to the embodiment, the outer diameter of shaft 16 shown in FIGS. 1 and 2 is larger than the size (the length of the diagonal) of the second end face 21*b* of element body 21; however, it can be the same or smaller. In case when the outer diameter of shaft 16 is longer than the size (the length of the circumscribed circle) of the second end face 21*b* of element body 21, however, the following merit can be obtained.

Namely, the adhesion between the second end face 21*b* of element body 21 and bottom side end face 18 of shaft 16 is easy to be uniform, when the second end face 21*b* of element 21 is completely coated with the bottom end face of shaft 16; and there is an advantage that a nonuniformity in adhesive strength is seldom generated. In addition, there is also a merit that the displacement of element body 21 is efficiently transmitted to shaft 16 easily. In addition, the second end face 21*b* of element 21 is completely coated with the bottom end face of shaft 16; and thus, the outer peripheral edge part of shaft 16 does not intersect internal electrodes 24, 25. Therefore, a stress from the outer peripheral edge part of shaft 16 does not act on the interface of piezoelectric layer 22 and internal electrodes 24, 25.

The Second Embodiment

Figure 4A:
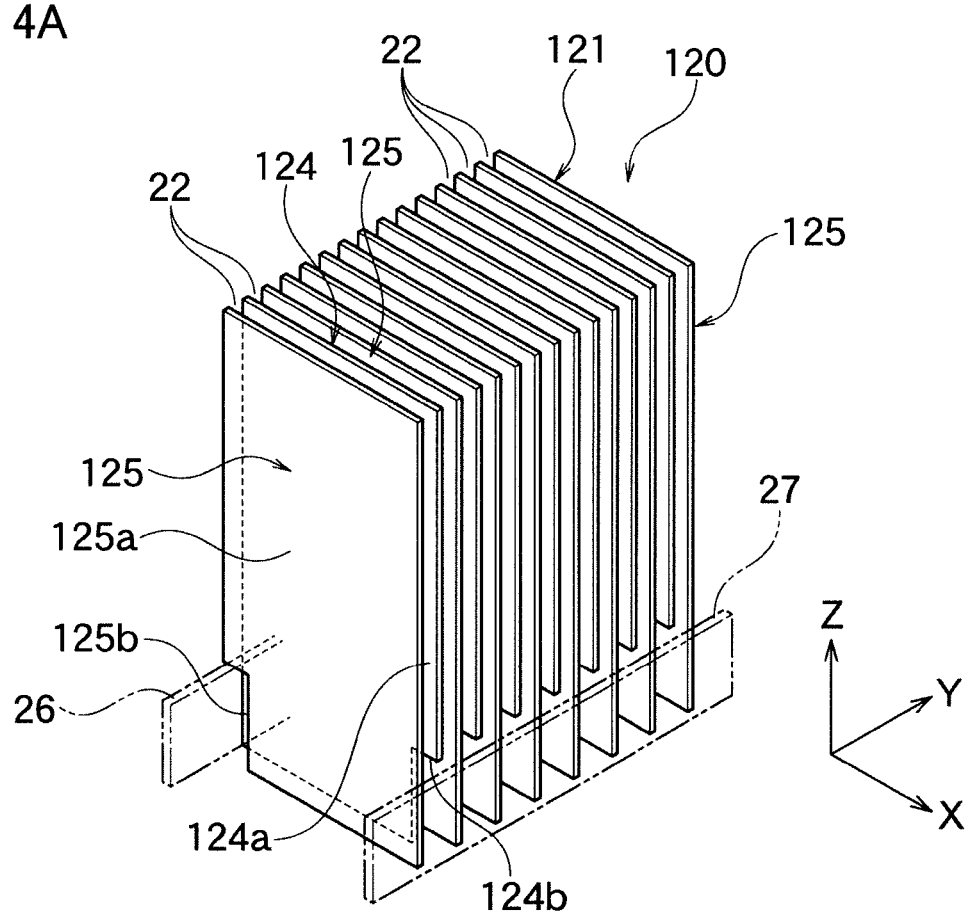
FIG. 4A is a perspective view showing a laminated structure of the internal electrode according to the other embodiment of the invention.
Figure 4B:
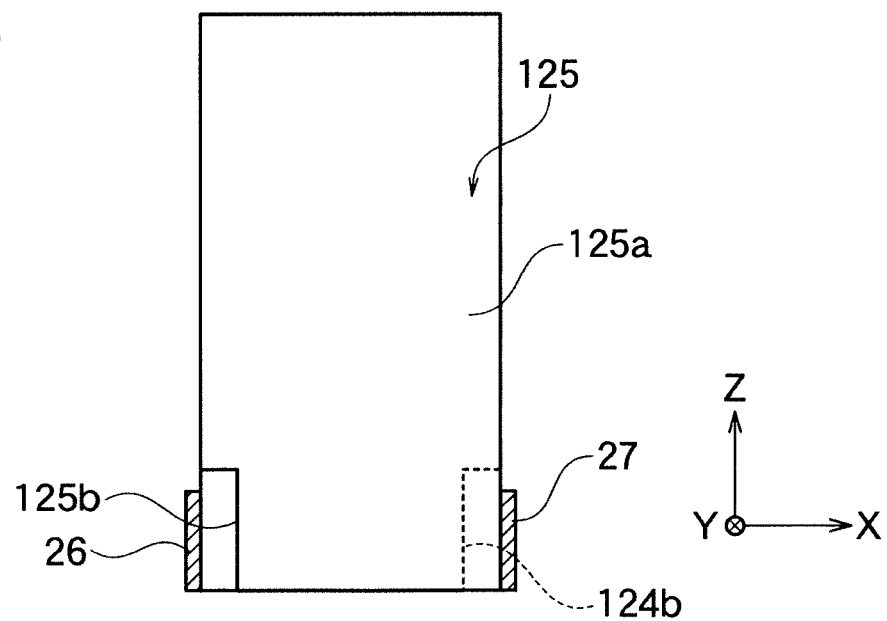
FIG. 4B is a front view of the internal electrode shown in FIG. 4A.

As shown in FIGS. 4A and 4B, laminated piezoelectric element 120 of the piezoelectric drive device according to the present embodiment has a similar composition with the same in the first embodiment and the similar effects can be obtained, except the patterns of the first internal electrode 124 and the same of the second internal electrode 125 are different from those in the first embodiment. Hereinafter, only the different part is mainly described in detail and an explanation of the common part is omitted. In addition, names of common parts are used for the common parts, and the overlapped explanation thereof is omitted.

The first internal electrode 124 has electrode body 124*a*, having a width in X axial direction approximately the same with a width of element body 121 in X axial direction. Electrode body 124*a* forms cutout part 124*b*, at a side in X axial direction and at a bottom end in Z axial direction, in order to electrically insulate the second external electrode 27. Cutout part 124*b* is formed completely avoiding the second external electrode 27. The side edge part of electrode body 124*a* on the opposite side of cutout part 124*b* in X axial direction is exposed from a side face of element body 121, and connected to the first external electrode 26.

Similarly, the second internal electrode 125 has electrode body 125*a*, having a width in X axial direction approximately the same with a width of element body 121 in X axial direction. Electrode body 125*a* forms cutout part 125*b*, at the other side in X axial direction and at a bottom end in Z axial direction, in order to electrically insulate the first external electrode 26. Cutout part 125*b* is formed completely avoiding the first external electrode 26. The side edge part of electrode body 125*a* on the opposite side of cutout part 125*b* in X axial direction is exposed from a side face of element body 121, and connected to the second external electrode 27.

The first internal electrode 124 and the second internal electrode 125, each having such patterns, are laminated in Y axial direction having piezoelectric layer 22 in-between. Thus, laminated piezoelectric element 120 similar to laminated piezoelectric element 20 of the first embodiment can be obtained. According to the embodiment, in the limited size of element body 121, internal electrodes 124, 125 having larger areas relative to the same of the first embodiment can be alternately arranged. Thus, it is possible to increase a volume of the laminated layer and to enhance a drive amount.

Note, according to the present embodiment, side parts of internal electrodes 124, 125 may expose at the surfaces of opposing sides of element body 121 in X axial direction, where external electrodes 26, 27 are not formed. Thus, the insulating protective layer is preferably formed on said surfaces.

The Third Embodiment

Figure 5A:
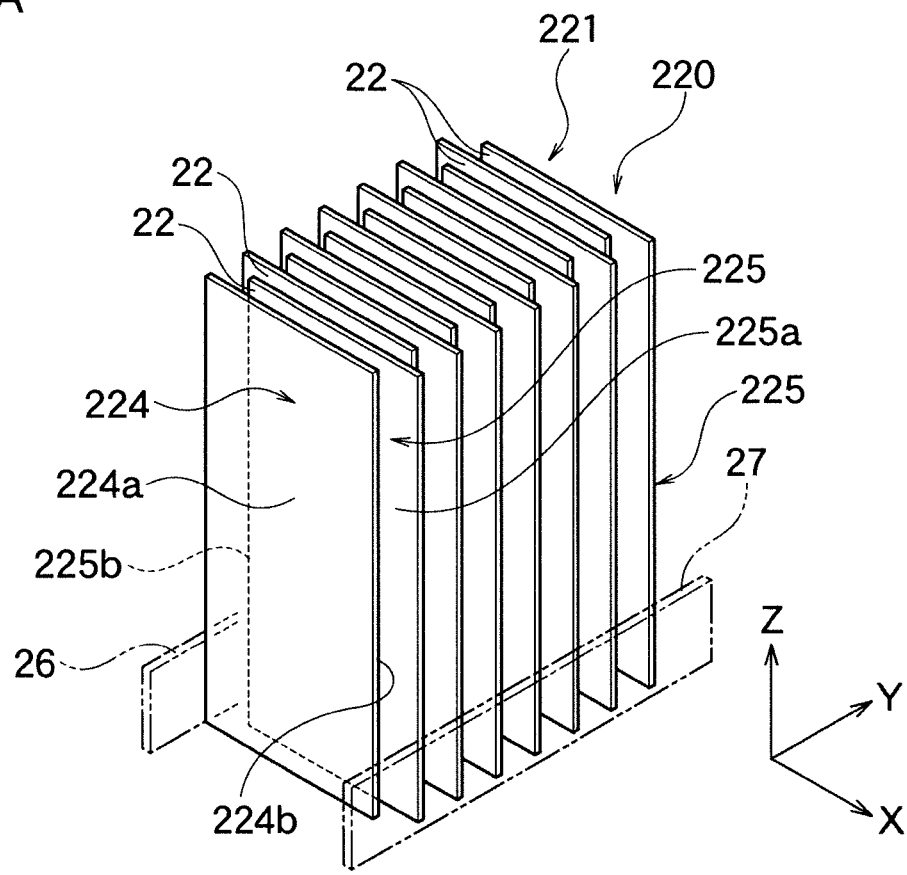
FIG. 5A is a perspective view showing a laminated structure of the internal electrode according to another embodiment of the invention.
Figure 5B:
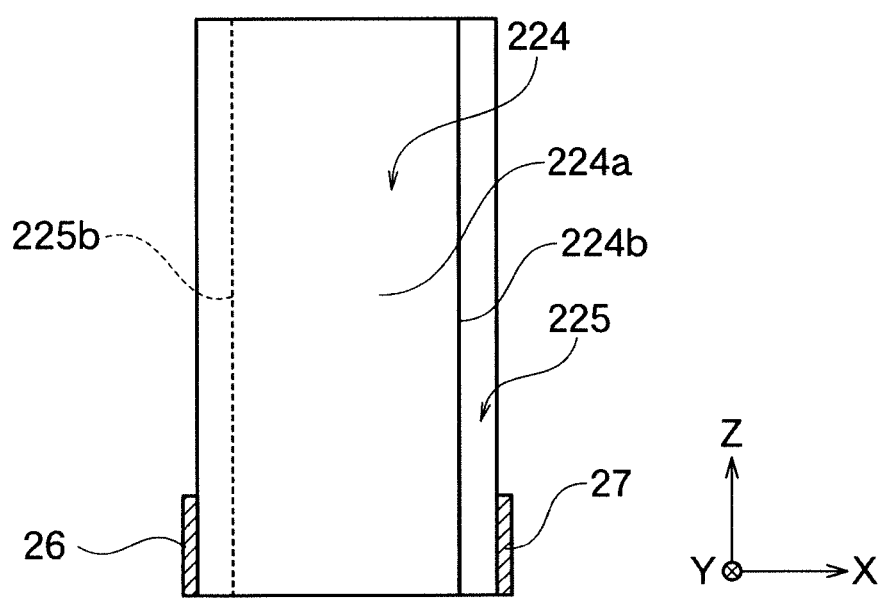
FIG. 5B is a front view of the internal electrode shown in FIG. 5A.

As shown in FIGS. 5A and 5B, laminated piezoelectric element 220 of the piezoelectric drive device according to the present embodiment has a similar composition with the same in the first embodiment and the similar effects can be obtained, except the patterns of the first internal electrode 224 and the same of the second internal electrode 225 are different from those in the first embodiment. Hereinafter, only the different part is mainly described in detail and an explanation of the common part is omitted. In addition, names of common parts are used for the common parts, and the overlapped explanation thereof is omitted.

The first internal electrode 224 has electrode body 224*a*, having a width in X axial direction narrower than a width of element body 221 in X axial direction. Electrode body 224*a* forms cutout part 224*b*, continuous in Z axial direction, at one side in X axial direction, in order to electrically insulate with the second external electrode 27. Cutout part 224*b* is formed completely avoiding the second external electrode 27. The side edge part of electrode body 224*a* on the opposite side of cutout part 224*b* in X axial direction is exposed from a side face of element body 221, and connected to the first external electrode 26.

Similarly, the second internal electrode 225 has electrode body 225*a*, having a width in X axial direction approximately the same with a width of element body 221 in X axial direction. Electrode body 225a forms cutout part 225b, at the other side in X axial direction and at a bottom end in Z axial direction, in order to electrically insulate the first external electrode 26. Cutout part 225b is formed completely avoiding the first external electrode 26. The side edge part of electrode body 225a on the opposite side of cutout part 225b in X axial direction is exposed from a side face of element body 221, and connected to the second external electrode 27.

The first internal electrode 224 and the second internal electrode 225, each having such patterns, are laminated in Y axial direction having piezoelectric layer 22 in-between. Thus, laminated piezoelectric element 220 similar to laminated piezoelectric element 20 of the first embodiment can be obtained. According to the present embodiment, patterns of internal electrodes 224, 225 are simpler than the same of the above embodiments, and that manufacturing laminated piezoelectric element 220 becomes easier.

The Fourth Embodiment

Figure 6:
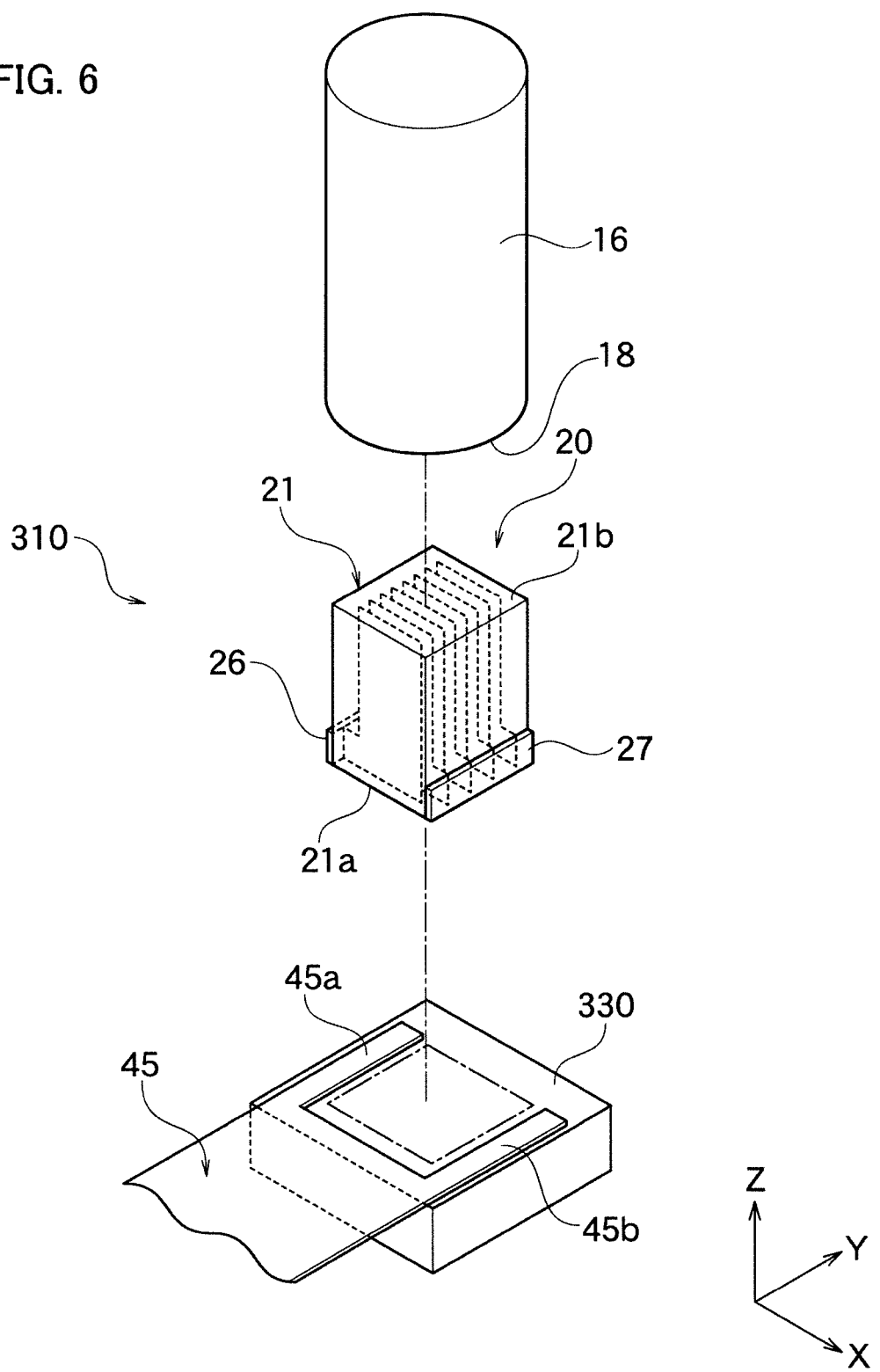
FIG. 6 is an exploded perspective view of the piezoelectric drive device according to the other embodiment of the invention.

As shown in FIG. 6, piezoelectric drive device 310 according to the present embodiment has a similar composition with the same in the first to the third embodiments and the similar effects thereof can be obtained, except a relation between weight member 330 and FPC 45 is different from the same in the first to the third embodiments. Hereinafter, only the different part is mainly described in detail and an explanation of the common part is omitted. In addition, names of common parts are used for the common parts, and the overlapped explanation thereof is omitted.

According to the present embodiment, an area of weight member 330 in a plane including X and Y axial directions is made larger, relative to the same of weight member 30 in the first embodiment. The first wire 45a and the second wire 45b of FPC 45 are mounted on the surface of weight member 330. In addition, weight member 330 can be placed directly on surface 42, without providing concave part 44 on frame 40 shown in FIG. 2.

The Fifth Embodiment

Figure 7:
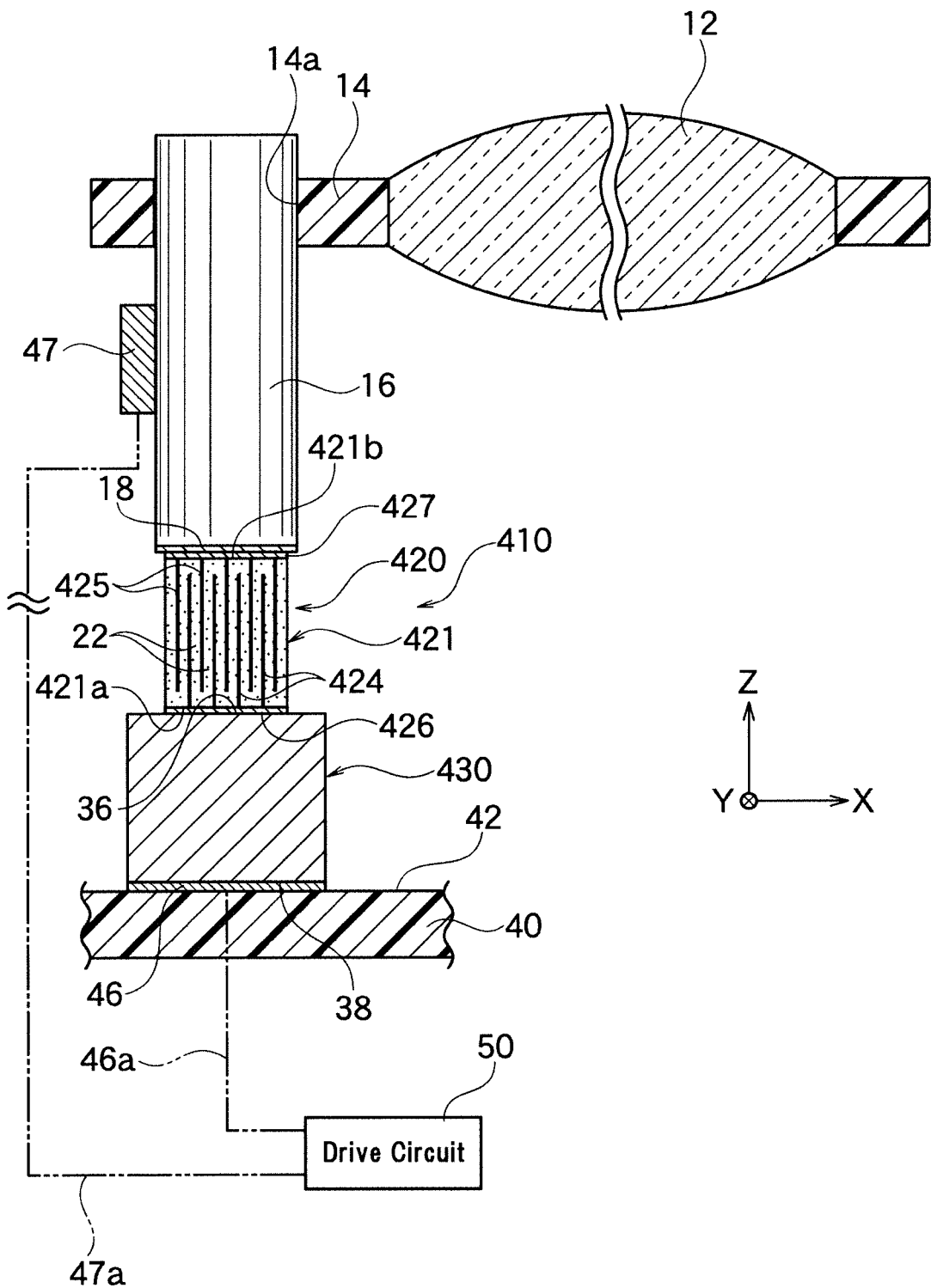
FIG. 7 is a schematic cross sectional view of a lens drive device having the piezoelectric drive device according to the other embodiment of the invention.
Figure 8:
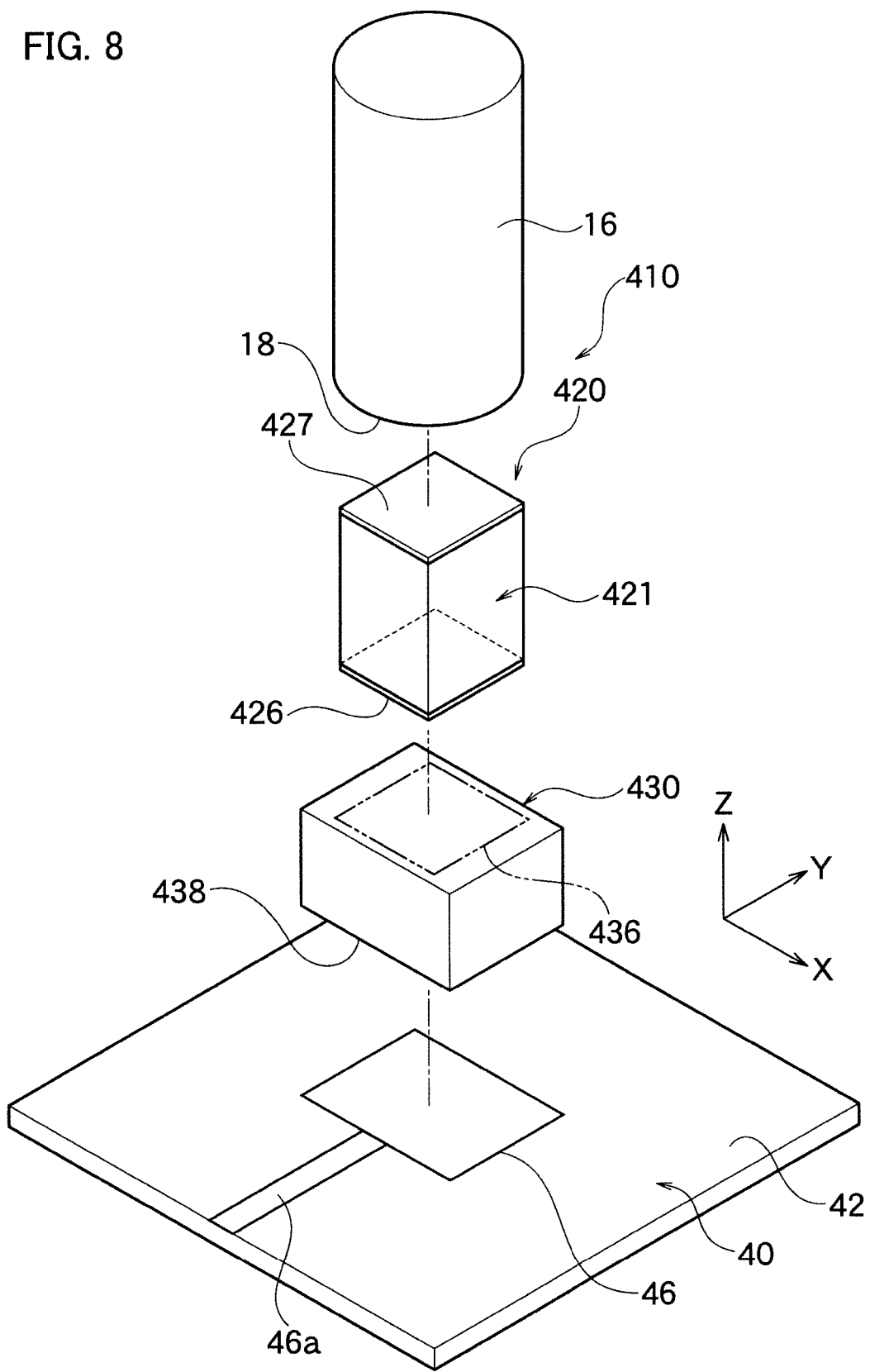
FIG. 8 is an exploded perspective view of the piezoelectric drive device shown in FIG. 7.

As shown in FIG. 7, piezoelectric drive device 410 according to the present embodiment has a similar composition with the same according to the first to fourth embodiments and the similar effects thereof can be obtained, except for the followings. Hereinafter, only the different part is mainly described in detail and an explanation of the common part is omitted. In addition, names of common parts are used for the common parts, and the overlapped explanation thereof is omitted.

According to the present embodiment, inside element body 421 of laminated piezoelectric element 420, the first internal electrode 424 is arranged, exposing to the first end face 421a and not exposing to the second end face 421b. Further, inside element body 421, the second internal electrode 425 is arranged, exposing to the second end face 421b and not exposing to the first end face 421a. The first internal electrode 424 and the second internal electrode 425 have a flat surface approximately perpendicular to the first end face 421a and the second end face 421b, and are alternately laminated in X axial direction having piezoelectric layer 22 in-between.

The first external electrode 426 is formed on the first end face 421a of element body 421, and coats the entire first end face 421a. The second external electrode 427 is formed on the second end face 421b and coats the entire second end face 421b. A plural number of the first internal electrode 424 are connected to the first external electrode 426, and a plural number of the second internal electrode 425 are connected to the second external electrode 427.

Metal face of the weight side 436 is formed on a counter surface of weight member 430, corresponding to the bottom face of laminated piezoelectric element 420 in Z axial direction, in which the first external electrode 426 is metal bonded. Bottom face of weight member 430 in Z axial direction also becomes the metal face, and is metal bonded to a circuit pattern of the frame side 46 (the first wire) formed on surface 42 of frame 40.

Note, weight member 430 can be composed of insulating materials such as plastic, ceramic, etc. In this case, a metal face of the weight side 436 is needed to be formed on a counter surface of weight member 430, corresponding to the bottom face of laminated piezoelectric element 420 in Z axial direction, in which the first external electrode 426 is metal bonded. The bottom face of weight member 430 in Z axial direction is also needed to be a metal face. It is also required to electrically connect said metal face of the weight side 436 and said metal face. Thus, a circuit pattern composed of such as a metal film can be formed on the surface of insulating weight member 430.

In case when weight member 430 is composed of metals, exterior surfaces except metal faces of metal face of the weight side 436 and weight mounting face 438 may be coated with an insulating film.

According to the present embodiment, the method for metal bonding is not particularly limited, however, a solid phase jointing technology such as ultrasonic jointing, solid phase diffusion jointing, friction jointing or a weld jointing such as laser, pulse heat, etc. may be used.

Circuit pattern of the frame side 46 and lead pattern 46a integrally connected thereto are formed on the surface of frame 40. As shown in FIG. 1, drive circuit 50 is connected to lead pattern 46a of circuit pattern of the frame side 46. Lead pattern 46a is connected to drive circuit 50 shown in FIG. 1. These patterns 46, 46a can be formed on the surface of frame 42 composed with the insulating material by performing firing method, plating method, sputtering method, etc. of a metal paste.

According to the present embodiment, as shown in FIG. 7, a connection between laminated piezoelectric element 420 and shaft 16 is obtained by metal bonding the metal face at the shaft side formed at bottom side end face 18 of shaft 16 in Z axial direction and the second external electrode 42 formed on top of laminated piezoelectric element 420 in Z axial direction. Said metal bonding is performed by the method mentioned above. The metal bonding of each part may be performed separately or simultaneously. Note, in case when shaft 16 is composed by a metal, the metal face at the shaft side is the bottom side end face 18 of shaft 16 in Z axial direction itself. In case when shaft 16 is not composed by metal, a metal film is made to form the metal face on bottom side end face 18 of shaft 16 in Z axial direction.

Shaft pressing 47 contacts shaft 16 in the middle of said shaft 16 along Z axial direction at a position not hindering the movement of lens frame 14 in Z axial direction. Shaft pressing 47 has functions for a support of shaft 16, a positioning of shaft 16, etc. Shaft pressing 47 is generally installed in a lens drive device. According to the present embodiment, shaft pressing 47 itself may be composed of a conductive material, or shaft pressing 47 itself may be composed of an insulating material and a circuit pattern or a conductive material is provided to form conductive paths at the contacting part of shaft 16.

In case when shaft pressing 47 is composed of a conductive material, wire (the second wire) 47a is connected to shaft pressing 47. Wire 47a is connected to drive circuit 50. At least a part of wire 47a may be composed of a lead wire; however, for instance, wire 47a is preferably composed of a circuit pattern formed on the surface of frame 40. In case when shaft pressing 47 is composed of insulating materials, wire 47a is connected to a circuit pattern formed on the surface of shaft pressing 47. The circuit pattern formed on the surface of shaft pressing 47 is electrically connected to the surface of shaft 16.

In case when shaft 16 is composed of a conductive material, one of voltages from drive circuit 50 is transmitted to shaft pressing 47 itself or to its circuit pattern via wire 47a, and further transmitted to the second external electrode 27 via shaft 16 and the metal face of bottom side end face 18. In case when shaft 16 is composed of an insulating material, said voltage is transmitted to the second external electrode 27 via the circuit pattern formed on the surface of shaft 16 and the metal face of bottom side end face 18. The other voltage from drive circuit 50 is transmitted to the first external electrode 26 via lead pattern 46a, circuit pattern of the frame side 46 and weight member 30.

In piezoelectric drive device 410 according to the present embodiment, lead wire, metal end, etc. are not connected to laminated piezoelectric element 420 by such as solder. Electric power supply to laminated piezoelectric element 420 is performed by a metal bond, between metal face of the weight side 436 and the first exterior connecting part 426, and a metal bond, between bottom side end face 18 of shaft 16 and the second exterior connecting part 427. The part where such metal bonding is performed is a part where a reverse polarity voltage is applied for driving laminated piezoelectric element 420, and at the same time, said part is a connection between laminated piezoelectric element 420 and weight member 430, as well as a connection between laminated piezoelectric element 420 and shaft 16.

Therefore, it is possible to simultaneously secure a strong connection between laminated piezoelectric element 420 and weight member 430, a strong connection between laminated piezoelectric element 420 and shaft 16, and a wiring for electrically connecting with laminated piezoelectric element 420. Thus, even when laminated piezoelectric element 420 is miniaturized, the connection between laminated piezoelectric element 420 and weight member 430 becomes easy, the connection between laminated piezoelectric element 420 and shaft 16 also becomes easy, and wiring with laminated piezoelectric element 420 for the electric power supply becomes easy. In addition, an automation work thereof also becomes easy.

In addition, wiring materials such as the lead wire, the metal terminal, etc. are not connected to laminated piezoelectric element 420 separately with the weight member. Thus, a sudden force does not act on the wiring materials, and does not disconnect at the connection part with wiring material. Further, at least a part of (or all of) shaft 16 and at least a part of (or all of) weight member 340 are also a wire; and thus, it contributes to a reduction in the number of parts.

In addition, laminated piezoelectric element 420 and weight member 430 are connected by metal bonding, and laminated piezoelectric element 42 and shaft 16 are connected by metal bonding, and thus, connecting strength thereof improve. Further, in relative to the case when these are connected by an adhesive agent, displacement absorption is less at the adhesive agent part, and the displacement force of laminated piezoelectric element 420 is directly transmitted to weight member 430 and shaft 16, which enhances driving force (less loss of the displacement).

According to the present embodiment, by composing weight member 430 with a metal, a density of weight member 430 is heightened and contributes to a miniaturization of piezoelectric drive device 410. Further, when composing weight member 430 by a metal, the exterior surface of weight member 430 composes a metal face of the weight side itself. And thus, there is no need to form a metal face other than weight member 430. Note, when weight member 430 is composed by materials other than metal, the metal face of the weight side, metal bonding with laminated piezoelectric element, can be formed with a circuit pattern such as a metal film.

Shaft pressing 47 contacts shaft 16, and the power can be supplied to the metal face of shaft side via shaft 16 and shaft pressing 47. For instance, the shaft pressing is a required part such as in lens drive device; the power can be supplied to laminated piezoelectric element 420 via shaft 16 and bottom side end face 18 without increasing the number of parts.

According to the present embodiment, when shaft 16 is a metal, the metal face of bottom side end face 18 can be easily formed using the exterior surface of shaft 16 itself. In this case, shaft 16 itself becomes electrically conductive path. It is the same when shaft 16 is a conductive material other than metal. Note, in order to form the metal surface at bottom side end face 18, a circuit pattern can be formed such as by metal film at a predetermined position. It is the same when shaft 16 is the insulating material.

According to the present embodiment, weight member 430 is connected to frame 40, and at the same time, circuit pattern 46 formed on frame 40 is electrically connected to weight member 430. These connections can be performed by metal bonding.

Note, in the embodiments above, the ultrasonic jointing is used for the metal bonding; however, the other methods can be used. The other methods for metal bonding exemplify solid phase diffusion jointing, friction jointing, laser, pulse heat, etc.

According to the present embodiment, laminated piezoelectric element 20 and weight member 30 are metal bonded, laminated piezoelectric element 20 and shaft 16 are metal bonded as well, and the other part may be bonded by other than metal bonding. For instance, weight member 30 and frame 40 can be connected by such as a solder joint or an adherence joint including a conductive adhesive agent, other than metal bonding.

The Sixth Embodiment

Figure 9:
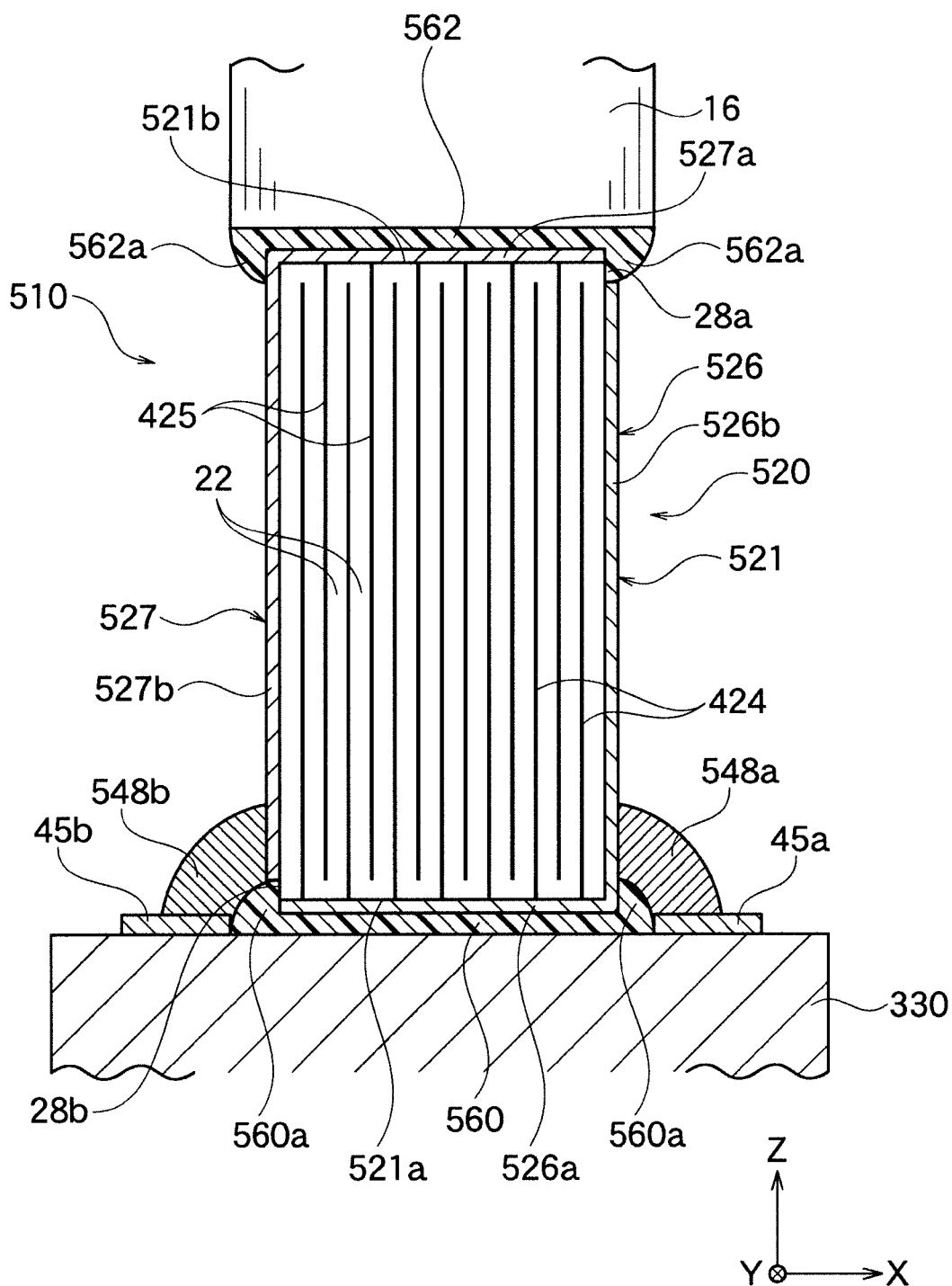
FIG. 9 is a schematic cross sectional view of a main part of the piezoelectric drive device according to the other embodiment of the invention.

As shown in FIG. 9, piezoelectric drive device 510 according to the present embodiment has a similar composition with the same according to the first to fifth embodiments and the similar effects thereof can be obtained, except for the followings. Hereinafter, only the different part is mainly described in detail and an explanation of the common part is omitted. In addition, names of common parts are used for the common parts, and the overlapped explanation thereof is omitted.

According to the present embodiment, inside element body 521 of laminated piezoelectric element 520, similar with element body 421 of the fifth embodiment, the first internal electrode 424 is arranged, exposing to the first end face 521a and not exposing to the second end face 521b. Further, inside element body 521, the second internal electrode 425 is arranged, exposing to the second end face 521b and not exposing to the first end face 521a. The first internal electrode 424 and the second internal electrode 425 each has a flat surface approximately perpendicular to the first end face 521a and the second end face 521b, and are alternately laminated in X axial direction having piezoelectric layer 22 in-between.

The first end face electrode 526a of the first external electrode 526 is formed on the first end face 521a of element body 521, as to coat the entire first end face 521a. The second end face electrode 527a of the second external electrode 527 is formed on the second end face 521b, as to coat the entire second end face 521b. A plural number of the first internal electrode 424 are connected to the first end face electrode 526a of the first external electrode 526, and a plural number of the second internal electrode 425 are connected to the second end face electrode 527a of the second external electrode 527.

The first external electrode 526 includes the first end face electrode 526a formed on the first end face 521a and the first side face electrode 526b formed continuously from the first end face electrode 526a at one side of the laminated piezoelectric element 521, and the second external electrode 527 includes the second end face electrode 527a formed on the second end face 521b and the second side face electrode 527b formed continuously from the second end face electrode 527a at the other side of the laminated piezoelectric element 521.

According to the present embodiment, an edge of the first side face electrode 526b is placed near the second end face 521b of element body 521, however, gap 28a is set in order to insulate and not to connect to the second end face electrode 527a. In addition, and edge of the second side face electrode 527b is placed near the first end face 521a of element body 521, however, gap 28b is set in order to insulate and not to connect to the first end face electrode 526a.

The first adhesive agent 560, adhering the first end face 521a of laminated piezoelectric element 520 to weight member 330, extends to a side of element 520 at a circumference of lower end of element 520 in Z axial direction, and bulging part 560b is formed. Bulging part 560b coats outer periphery of an edge of the second side face electrode 527b sufficiently sealing gap 28a, and secure insulation between the second side face electrode 527b and the first end face electrode 526a.

The second adhesive agent 562, adhering the second end face 521b of laminated piezoelectric element 520 to the lower end of shaft member 16, extends to a side of element 520 at a circumference of upper end of element 520 in Z axial direction, and bulging part 562a is formed. Bulging part 562a coats outer periphery of an edge of the first side face electrode 526b sufficiently sealing gap 28a, and secure insulation between the first side face electrode 526b and the second end face electrode 527a.

According to the present embodiment, the first wire 45a is connected to the first side face electrode 526b and the second wire 45b is connected to the second side face electrode 527b; and thus, wire 45a, 45b for external circuit can be provided only to the side of weight member 330. In addition, the first end face 521a is coated with the first end face electrode 526a, and the second end face 521b is coated with the second end face electrode 527a. Thus, said ends 521a, 521b can be efficiently protected.

According to the present embodiment, connecting member 548a, 548b, connecting wire 45a, 45b and one of the first side face electrode 526b and the second side face electrode 527b, is formed to contact bulging part 560b of the first adhesive agent 560. Thus, connecting member 548b is prevented to enter the gap between the second side face electrode 527b and the first end face electrode 526a.

According to the present embodiment, when wire 45a, 45b is placed to the external circuit near bottom end of shaft 16, connecting member, connecting wire 45a, 45b and one of the first side face electrode 526b and the second side face electrode 527b, is formed to contact bulging part 562a of the second adhesive agent 562, and is prevented to enter gap 28a between the first side face electrode 526b and the second end face electrode 527a.

Note, the invention is not limited to the embodiments described above and the invention can be varied in various modes within a range of the invention.

For instance, in the embodiments above, the drive device, moving lens frame 14 holding lens 12 along the shaft, is exemplified as piezoelectric drive device 10, 310, 410, 510; however, the movable body can be any material other than the lens frame. The movable body can exemplify such as a board spring called slider.

NUMERICAL REFERENCES 10, 310, 410, 510 . . . Piezoelectric drive device
12 . . . Lens
14 . . . Lens frame
14a . . . Through hole
16 . . . Shaft
18 . . . Bottom side end face
20, 120, 220, 420, 520 . . . Laminated piezoelectric element
21, 121, 221, 421, 521 . . . Element body
21a, 421a, 521a . . . The first end face
21b, 421b, 521b . . . The second end face
22 . . . Piezoelectric layer
24, 124, 224, 424 . . . The first internal electrode
24a, 124a, 224a . . . Electrode body
24b . . . Lead
124b, 224b . . . Cutout part
25, 125, 225, 425 . . . The second internal electrode
25a, 125a, 225a . . . Electrode body
25b . . . Lead
125b, 225b . . . Cutout part
26, 426, 526 . . . The first external electrode
526a . . . The first end face electrode
526b . . . The first side face electrode
27, 427, 527 . . . The second external electrode
527a . . . The second end face electrode
527b . . . The second side face electrode
28a, 28b . . . Gap
30, 330, 430 . . . Weight member
436 . . . Metal face of the weight side
438 . . . Weight mounting face
40 . . . Frame
42 . . . Surface
44 . . . Concave part
45 . . . FPC, Flexible Printed Circuit Board
45a . . . The first wire
45b . . . The second wire
46 . . . Circuit pattern of the frame side
46a . . . Lead pattern
47 . . . Shaft pressing
48a, 48b, 548a, 548b . . . Connecting member
50 . . . Drive circuit
60, 560 . . . The first adhesive agent
560b . . . Bulging part
62, 562 . . . The second adhesive agent
562a . . . Bulging part

The invention claimed is:

1. A piezoelectric drive device comprising:
a laminated piezoelectric element comprising a first end face and a second end face opposed to the first end face;
a weight member attached to the first end face of the laminated piezoelectric element; and
a shaft attached to the second end face of the laminated piezoelectric element,
wherein a moving member, engaged to a shaft movable in an axial direction, is moved in the axial direction by activating the laminated piezoelectric element,
a first internal electrode and a second internal electrode, respectively having a plane surface which is approximately perpendicular to the first end face and the second end face, are laminated in a direction approximately perpendicular to the first internal electrode and the second internal electrode with a piezoelectric layer in-between, inside the laminated piezoelectric element, and
a length of the laminated piezoelectric element corresponding to a distance between the first end face and the second end face is longer than a thickness of the laminated piezoelectric element in the laminated direction along the direction approximately perpendicular to the first internal electrode and the second internal electrode.

2. The piezoelectric drive device according to claim 1, wherein
a first external electrode connected to the first internal electrode and a second external electrode connected to the second internal electrode are respectively formed on a side of the laminated piezoelectric element, located close to either one of the first end face and the second end face.

3. The piezoelectric drive device according to claim 2, wherein
the weight member is adhered to the first end face via a first adhesive agent, and the shaft is adhered to the second end face via a second adhesive agent.

4. The piezoelectric drive device according to claim 3, wherein the first adhesive agent is also a member for fixing the weight member to a concave part of a frame member.

5. The piezoelectric drive device according to claim 1, wherein
a first external electrode connected to the first internal electrode and a second external electrode connected to the second internal electrode are respectively formed on a side of the laminated piezoelectric element, located close to either one of the first end face and the second end face.

6. The piezoelectric drive device according to claim 5, wherein
the weight member is adhered to the first end face via a first adhesive agent, and the shaft is adhered to the second end face via a second adhesive agent.

7. The piezoelectric drive device according to claim 6, wherein the first adhesive agent is also a member for fixing the weight member to a concave part of a frame member.

8. The piezoelectric drive device according to claim 1, wherein
the weight member is adhered to the first end face via a first adhesive agent, and the shaft is adhered to the second end face via a second adhesive agent.

9. The piezoelectric drive device according to claim 8, wherein the first adhesive agent is also a member for fixing the weight member to a concave part of a frame member.

10. The piezoelectric drive device according to claim 1, wherein
a first external electrode connected to the first internal electrode is formed on the first end face and a second external electrode connected to the second internal electrode is formed on the second end face.

11. The piezoelectric drive device according to claim 10, wherein
the first external electrode comprises: a first end face electrode formed on the first end face; and a first side face electrode formed continuously from the first end face electrode on a side of the laminated piezoelectric element, and
the second external electrode comprises: a second end face electrode formed on the second end face; and a second side face electrode formed continuously from the second end face electrode on the other side of the laminated piezoelectric element.

12. The piezoelectric drive device according to claim 11, wherein
an end of the second side face electrode, placed close to the first end face electrode, is insulated from said first end face electrode by a first adhesive agent, which adheres the first end face of the laminated piezoelectric element to the weight member.

13. A piezoelectric drive device comprising:
a laminated piezoelectric element comprising a first end face and a second end face opposed to the first end face;
a weight member attached to the first end face of the laminated piezoelectric element; and
a shaft attached to the second end face of the laminated piezoelectric element,
wherein a moving member, engaged to a shaft movable in an axial direction, is moved in the axial direction by activating the laminated piezoelectric element,
a first internal electrode and a second internal electrode, respectively having a plane surface which is approximately perpendicular to the first end face and the second end face, are laminated in a direction approximately perpendicular to the first internal electrode and the second internal electrode with a piezoelectric layer in-between, inside the laminated piezoelectric element, and
the weight member is adhered to the first end face via a first adhesive agent, and the shaft is adhered to the second end face via a second adhesive agent.

14. The piezoelectric drive device according to claim 13, wherein the first adhesive agent is also a member for fixing the weight member to a concave part of a frame member.

15. A piezoelectric drive device comprising:
a laminated piezoelectric element comprising a first end face and a second end face opposed to the first end face;
a weight member attached to the first end face of the laminated piezoelectric element; and
a shaft attached to the second end face of the laminated piezoelectric element,
wherein a moving member, engaged to a shaft movable in an axial direction, is moved in the axial direction by activating the laminated piezoelectric element,
a first internal electrode and a second internal electrode, respectively having a plane surface which is approximately perpendicular to the first end face and the second end face, are laminated in a direction approximately perpendicular to the first internal electrode and the second internal electrode with a piezoelectric layer in-between, inside the laminated piezoelectric element, and a first external electrode connected to the first internal electrode is formed on the first end face and a second external electrode connected to the second internal electrode is formed on the second end face.

16. The piezoelectric drive device according to claim 15, wherein the first external electrode comprises: a first end face electrode formed on the first end face; and a first side face electrode formed continuously from the first end face electrode on a side of the laminated piezoelectric element, and the second external electrode comprises: a second end face electrode formed on the second end face; and a second side face electrode formed continuously from the second end face electrode on the other side of the laminated piezoelectric element.

17. The piezoelectric drive device according to claim 16, wherein an end of the second side face electrode, placed close to the first end face electrode, is insulated from said first end face electrode by a first adhesive agent, which adheres the first end face of the laminated piezoelectric element to the weight member.

\* \* \* \* \*